US012598846B2

(12) United States Patent
Song et al.

(10) Patent No.: US 12,598,846 B2
(45) Date of Patent: Apr. 7, 2026

(54) ARRAY SUBSTRATE, MANUFACTURING METHOD THEREOF, AND DISPLAY PANEL

(71) Applicant: Wuhan China Star Optoelectronics Technology Co., Ltd., Hubei (CN)

(72) Inventors: Jiyue Song, Hubei (CN); Fei Ai, Hubei (CN); Dewei Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 378 days.

(21) Appl. No.: 17/414,019

(22) PCT Filed: Jun. 4, 2021

(86) PCT No.: PCT/CN2021/098415
§ 371 (c)(1),
(2) Date: Jun. 15, 2023

(87) PCT Pub. No.: WO2022/241863
PCT Pub. Date: Nov. 24, 2022

(65) Prior Publication Data
US 2024/0021765 A1 Jan. 18, 2024

(30) Foreign Application Priority Data

May 21, 2021 (CN) .......................... 202110557665.2

(51) Int. Cl.
*H10H 20/85* (2025.01)
*G06V 40/13* (2022.01)
(Continued)

(52) U.S. Cl.
CPC ........... *H10H 20/857* (2025.01); *G06V 40/13* (2022.01); *H10H 20/81* (2025.01); *H10H 20/032* (2025.01);
(Continued)

(58) Field of Classification Search
CPC .... H10H 20/857; H10H 20/81; H10H 20/032; H10H 20/034; H10H 20/036;
(Continued)

(56) References Cited

U.S. PATENT DOCUMENTS

2018/0232086 A1* 8/2018 Zhang ................... G06F 3/0443
2018/0373915 A1 12/2018 Ling et al.
(Continued)

FOREIGN PATENT DOCUMENTS

CN 107425038 12/2017
CN 108987455 12/2018
(Continued)

OTHER PUBLICATIONS

International Search Report and the Written Opinion Dated Feb. 15, 2022 From the International Searching Authority Re. Application No. PCT/CN2021/098415 and Its Translation Into English. (12 Pages).
(Continued)

*Primary Examiner* — S M Sohel Imtiaz

(57) ABSTRACT

In an array substrate of the present invention, only two insulating layers are arranged on a planarization layer. Compared with conventional techniques that require at least four insulating layers arranged on the planarization layer, a number of the insulating layers arranged on the planarization layer is reduced. Therefore, a number of photomasks is reduced in a manufacturing process of the array substrate, and the manufacturing process is simplified. The present invention also provides a manufacturing method of the array substrate, and a display panel.

20 Claims, 3 Drawing Sheets

(51) Int. Cl.

| | |
|---|---|
| *H10H 20/81* | (2025.01) |
| *H10H 20/857* | (2025.01) |
| *H10H 20/01* | (2025.01) |

(52) U.S. Cl.
CPC ......... *H10H 20/034* (2025.01); *H10H 20/036* (2025.01)

(58) Field of Classification Search
CPC ............... G06V 40/13; G06V 40/1318; H10D 30/6723; H10D 86/441; H10D 86/60; H10D 86/021; H10D 86/451
See application file for complete search history.

(56) References Cited

U.S. PATENT DOCUMENTS

| | | | | |
|---|---|---|---|---|
| 2019/0212853 | A1* | 7/2019 | Ma | H10D 86/0221 |
| 2020/0176477 | A1* | 6/2020 | Liu | H10D 86/60 |
| 2021/0055831 | A1* | 2/2021 | Long | G06F 3/0445 |
| 2021/0089154 | A1* | 3/2021 | Wang | G02F 1/1362 |
| 2021/0217784 | A1* | 7/2021 | Li | H10K 59/126 |
| 2021/0325988 | A1* | 10/2021 | Ma | G06F 3/0412 |

FOREIGN PATENT DOCUMENTS

| | | | | |
|---|---|---|---|---|
| CN | 110289297 | | 9/2019 | |
| CN | 110289297 A | * | 9/2019 | ............ H10K 59/12 |
| CN | 110865490 | | 3/2020 | |
| CN | 111599825 | | 8/2020 | |
| CN | 112198729 | | 1/2021 | |
| CN | 112420799 | | 2/2021 | |
| CN | 112713161 | | 4/2021 | |

OTHER PUBLICATIONS

Notification of Office Action and Search Report Dated Jun. 21, 2022 From the State Intellectual Property Office of the People's Republic of China Re. Application No. 202110557665.2 and Its Translation of Office Action Into English. (14 Pages).

Notification of Office Action and Search Report Dated Oct. 25, 2022 From the State Intellectual Property Office of the People's Republic of China Re. Application No. 202110557665.2 and Its Translation Into English. (18 Pages).

Notification of Office Action Dated Apr. 25, 2023 From the State Intellectual Property Office of the People's Republic of China Re. Application No. 202110557665.2 and Its Translation Into English. (14 Pages).

* cited by examiner

1

ARRAY SUBSTRATE, MANUFACTURING METHOD THEREOF, AND DISPLAY PANEL

RELATED APPLICATIONS

This application is a National Phase of PCT Patent Application No. PCT/CN2021/098415 having International filing date of Jun. 4, 2021, which claims the benefit of priority of Chinese Patent Application No. 202110557665.2 filed on May 21, 2021. The contents of the above applications are all incorporated by reference as if fully set forth herein in their entirety.

FIELD AND BACKGROUND OF THE INVENTION

The present application relates to a field of display technology, and in particular, to an array substrate, a manufacturing method thereof, and a display panel.

Fingerprint recognition technology has been widely used in small and medium-sized display panels. The technology is mainly of several types, which are capacitive, ultrasonic, and optical types. At present, the more mature type is the capacitive fingerprint recognition technology. Its working principle is using silicon wafers, together with a conductive subcutaneous electrolyte, to generate an electric field. A difference in heights of valleys and ridges of a fingerprint leads to different voltages output in the electric field, thereby realizing accurate fingerprint recognition. However, for capacitive fingerprint recognition technology, when the finger is wet, its recognition effect is significantly compromised. Compared with the capacitive fingerprint recognition technology, ultrasonic fingerprint recognition technology has advantages of higher penetration ability, better stability, and improved accuracy, but its cost is higher. The working principle of optical fingerprint recognition technology is using laws of refraction and reflection of light. Light irradiated on a finger is reflected by the finger to a photosensitive sensor. Because the valleys and the ridges of the fingerprint reflect the light differently, the photosensitive sensor receives reflected light with different intensity from the valleys and the ridges of the fingerprint, thus achieving accurate fingerprint recognition. Compared with the capacitive fingerprint recognition technology, the optical fingerprint recognition technology has advantages of higher penetration ability, better stability, and improved accuracy; and compared with ultrasonic fingerprint recognition technology, the optical fingerprint recognition technology has an advantage of lower cost. However, a manufacturing process of a display panel with the optical fingerprint recognition technology is complicated and troublesome.

SUMMARY OF THE INVENTION

The present invention provides an array substrate, a manufacturing method thereof, and a display panel, which are used to solve a problem that a conventional manufacturing process of a display panel with optical fingerprint recognition technology is complicated.

In a first aspect, the present invention provides an array substrate, comprising:

a substrate comprising a control element;

a third metal layer disposed on the substrate, the third metal layer comprising a first electrode, the first electrode electrically connected to the control element;

a diode arranged on the first electrode;

2 a first insulating layer disposed on the third metal layer and the diode;

a fourth metal layer disposed on the first insulating layer, the fourth metal layer comprising a second electrode, the second electrode disposed corresponding to the diode and electrically connected to the diode; and a second insulating layer disposed on the first insulating layer and the fourth metal layer.

In some embodiments, the third metal layer further comprises a touch electrode line, the fourth metal layer further comprises a common electrode integrally formed with the second electrode, and the common electrode is arranged corresponding to the touch electrode line and electrically connected to the touch electrode line.

In some embodiments, the substrate further comprises a switch element, the array substrate further comprises a fifth metal layer, the fifth metal layer is disposed on the second insulating layer, the fifth metal layer comprises a pixel electrode, and the pixel electrode is electrically connected to the switch element.

In some embodiments, a first through hole is defined in the first insulating layer to expose at least a portion of the diode, and the second electrode is electrically connected to the diode through the first through hole.

In some embodiments, a second through hole is defined in the first insulating layer to expose at least a portion of the touch electrode line, and the common electrode is electrically connected to the touch electrode line through the second through hole.

In some embodiments, a planarization layer is disposed between the substrate and the third metal layer; a third through hole is defined in the planarization layer, the first insulating layer, and the second insulating layer; and the pixel electrode is electrically connected to the switch element through the third through hole.

In some embodiments, the control element is a first thin film transistor, the first electrode is electrically connected to a source or a drain of the first thin film transistor, the switch element is a second thin film transistor, and the pixel electrode is electrically connected to a source or a drain of the second thin film transistor.

In some embodiments, an orthographic projection of the first electrode projected on the substrate covers an orthographic projection of the diode projected on the substrate, and an orthographic projection of the second electrode at least partially overlaps an orthographic projection of the first electrode projected on the substrate.

In some embodiments, an orthographic projection of the first electrode projected on the substrate and an orthographic projection of the second electrode projected on the substrate at least partially overlap an orthographic projection of the control element projected on the substrate.

In some embodiments, the first thin film transistor further comprises an active layer, and an orthographic projection of the first electrode projected on the substrate at least partially overlaps an orthographic projection of the active layer projected on the substrate.

In some embodiments, the diode is a PIN diode, the PIN diode comprises a first semiconductor layer and an intrinsic semiconductor layer, the first semiconductor layer is disposed on the first electrode, and the intrinsic semiconductor layer is arranged on the first semiconductor layer.

In some embodiments, the PIN diode further comprises a second semiconductor layer, and the second semiconductor layer is disposed on the intrinsic semiconductor layer.

In a second aspect, the present invention provides a manufacturing method of an array substrate, comprising:

providing a substrate, wherein the substrate comprises a control element;

forming a third metal layer on the substrate, wherein the third metal layer comprises a first electrode, and the first electrode is electrically connected to the control element;

developing a diode on the first electrode;

forming a first insulating layer on the third metal layer and the diode;

forming a fourth metal layer on the first insulating layer, wherein the fourth metal layer comprises a second electrode, and the second electrode is arranged corresponding to the diode and is electrically connected to the diode; and forming a second insulating layer on the first insulating layer and the fourth metal layer.

In a third aspect, the present invention provides a display panel comprising an array substrate, the array substrate comprising:

a substrate comprising a control element;

a third metal layer disposed on the substrate, the third metal layer comprising a first electrode, the first electrode electrically connected to the control element;

a diode arranged on the first electrode;

a first insulating layer disposed on the third metal layer and the diode;

a fourth metal layer disposed on the first insulating layer, the fourth metal layer comprising a second electrode, the second electrode disposed corresponding to the diode and electrically connected to the diode; and a second insulating layer disposed on the first insulating layer and the fourth metal layer.

In some embodiments, the third metal layer further comprises a touch electrode line, the fourth metal layer further comprises a common electrode integrally formed with the second electrode, and the common electrode is arranged corresponding to the touch electrode line and electrically connected to the touch electrode line.

In some embodiments, the substrate further comprises a switch element, the array substrate further comprises a fifth metal layer, the fifth metal layer is disposed on the second insulating layer, the fifth metal layer comprises a pixel electrode, and the pixel electrode is electrically connected to the switch element.

In some embodiments, a first through hole is defined in the first insulating layer to expose at least a portion of the diode, and the second electrode is electrically connected to the diode through the first through hole.

In some embodiments, a second through hole is defined in the first insulating layer to expose at least a portion of the touch electrode line, and the common electrode is electrically connected to the touch electrode line through the second through hole.

In some embodiments, a planarization layer is disposed between the substrate and the third metal layer; a third through hole is defined in the planarization layer, the first insulating layer, and the second insulating layer; and the pixel electrode is electrically connected to the switch element through the third through hole.

In some embodiments, the control element is a first thin film transistor, the first electrode is electrically connected to a source or a drain of the first thin film transistor, the switch element is a second thin film transistor, and the pixel electrode is electrically connected to a source or a drain of the second thin film transistor.

Advantage of the present invention:

The present invention provides an array substrate, comprising: a substrate comprising a control element; a third metal layer disposed on the substrate, the third metal layer comprising a first electrode, the first electrode electrically connected to the control element; a diode arranged on the first electrode; a first insulating layer disposed on the third metal layer and the diode; a fourth metal layer disposed on the first insulating layer, the fourth metal layer comprising a second electrode, the second electrode disposed corresponding to the diode and electrically connected to the diode; and a second insulating layer disposed on the first insulating layer and the fourth metal layer. In the array substrate of the present invention, only two insulating layers are disposed on the planarization layer, which are the first insulating layer and the second insulating layer. Compared with conventional techniques, which require that at least four insulating layers be disposed on the planarization layer, the present invention reduces the number of the insulating layers on the planarization layer, thereby reducing the number of photomasks in a manufacturing process of the array substrate and simplifying the manufacturing process.

DESCRIPTION OF SPECIFIC EMBODIMENTS OF THE INVENTION

In order to make the objectives, technical solutions, and functions of the present invention clearer and more specific, the present invention is described in detail below with reference to the accompanying drawings and embodiments. It should be noted that the specific embodiments described herein are only used to explain the present invention, but not used to limit the present invention.

Figure 1:
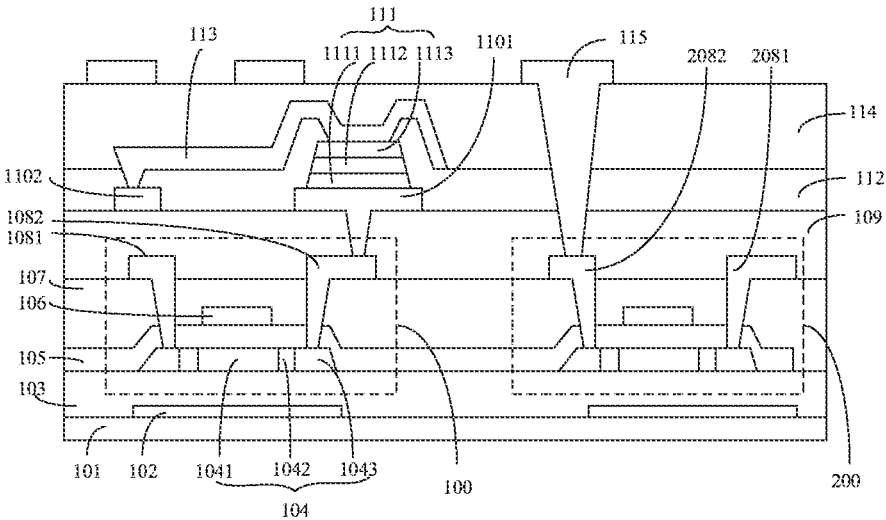
FIG. 1 is a schematic cross-sectional view illustrating an array substrate according to one embodiment of the present invention.

Please refer to FIG. 1. FIG. 1 is a schematic cross-sectional view of an array substrate according to one embodiment of the present invention. The array substrate shown in FIG. 1 comprises a substrate, a third metal layer, a diode 111, a first insulating layer 112, a fourth metal layer, and a second insulating layer 114.

The substrate comprises a control element 100. The control element 100 is preferably a thin film transistor, which is referred to as a first thin film transistor. The substrate can comprise a base plate 101, a first active layer 104, a gate insulating layer 105, a first metal layer, and a second metal layer. In addition, the substrate can also comprise any one or more of a light-shielding layer 102, a buffer layer 103, and an interlayer dielectric layer 107.

The base plate 101 can be a rigid substrate or a flexible substrate. A material of the base plate 101 can comprise one or more of glass, silicon dioxide, polyethylene, polypropylene, polystyrene, polylactic acid, polyethylene terephthalate, polyimide, and polyurethane.

The light-shielding layer 102 is disposed on the base plate 101, and a material of the light-shielding layer 102 can be metal.

The buffer layer 103 is disposed on the base plate 101 and the light-shielding layer 102, and a material of the buffer layer 103 can be silicon nitride or silicon oxide.

The first active layer 104 is disposed on the buffer layer 103 and arranged corresponding to the light-shielding layer 102. Specifically, an orthographic projection of the light-shielding layer 102 projected on the substrate covers an orthographic projection of the first active layer 104 projected on the substrate. The first active layer 104 comprises a polysilicon region 1041 in the middle, an N-type heavily doped region 1043 at two ends, and an N-type lightly doped region 1042 between the polysilicon region 1041 and the N-type heavily doped region 1043.

The gate insulating layer 105 is disposed on the buffer layer 103 and the first active layer 104, and a material of the gate insulating layer 105 can be silicon nitride, silicon oxide, or organic photoresist.

The first metal layer is disposed on the gate insulating layer 105. The first metal layer comprises a first gate 106. The first gate 106 is disposed corresponding to the first active layer 104. Specifically, the orthographic projection of the first active layer 104 projected on the substrate covers an orthographic projection of the first gate 106 projected on the substrate. A material of the first metal layer can be copper, aluminum, or titanium.

The interlayer dielectric layer 107 is disposed on the gate insulating layer 105 and the first metal layer, and a material of the interlayer dielectric layer 107 can be silicon nitride or silicon oxide.

The second metal layer is disposed on the interlayer dielectric layer 107. The second metal layer comprises a first source 1081 and a first drain 1082. The first source 1081 is arranged corresponding to the N-type heavily doped region 1043 at one end of the first active layer 104 and is electrically connected to the N-type heavily doped region 1043 at this end. The first drain 1082 is disposed corresponding to the N-type heavily doped region 1043 at another end of the first active layer 104 and is electrically connected to the N-type heavily doped region 1043 at this another end. A material of the second metal layer can be the same as the material of the first metal layer.

A planarization layer 109 is disposed between the substrate and the third metal layer. Specifically, the planarization layer 109 is disposed on the interlayer dielectric layer 107 and the second metal layer. A material of the planarization layer 109 can be silicon nitride, silicon oxide, or organic photoresist.

The third metal layer is disposed on the planarization layer 109. The third metal layer comprises a first electrode 1101, and the first electrode 1101 is electrically connected to the control element 100. Specifically, the first electrode 1101 is electrically connected to the first source 1081 or the first drain 1082 of the first thin film transistor. As shown in FIG. 1, the first electrode 1101 is electrically connected to the first drain 1082 of the first thin film transistor. A material of the third metal layer can be any one of titanium, aluminum, molybdenum, copper, or other suitable metal, and can also be a metal lamination material such as titanium-aluminum-titanium, molybdenum-copper, or molybdenum-aluminum-molybdenum.

The diode 111 is arranged on the first electrode 1101. The diode 111 is preferably a PIN diode. The PIN diode comprises a first semiconductor layer 1111 and an intrinsic semiconductor layer 1112. The first semiconductor layer 1111 is arranged on the first electrode 1101, and the intrinsic semiconductor layer 1112 is arranged on the first semiconductor layer 1111. A material of the first semiconductor layer 1111 is preferably N-type amorphous silicon (N+a-Si), and a material of the intrinsic semiconductor layer 1112 is preferably amorphous silicon (a-Si). In addition, the PIN diode can further comprise a second semiconductor layer 1113. The second semiconductor layer 1113 is disposed on the intrinsic semiconductor layer 1112, and a material of the second semiconductor layer 1113 is preferably P-type amorphous silicon (P+a-Si).

The first insulating layer 112 is disposed on the third metal layer and the diode 111, and a material of the first insulating layer 112 can be silicon nitride or silicon oxide.

The fourth metal layer is disposed on the first insulating layer 112. The fourth metal layer comprises a second electrode 113. The second electrode 113 is disposed corresponding to the diode 111 and is electrically connected to the diode 111. Specifically, an orthographic projection of the second electrode 113 projected on the substrate at least partially overlaps an orthographic projection of the first electrode 1101 projected on the substrate. A material of the fourth metal layer is preferably indium tin oxide.

The second insulating layer 114 is disposed on the first insulating layer 112 and the fourth metal layer, and a material of the second insulating layer 114 can be silicon nitride or silicon oxide.

It should be noted that the first active layer 104, the first gate 106, the first source 1081, and the first drain 1082 together constitute the control element 100, that is, the first thin film transistor. The first electrode 1101, the PIN diode, and the second electrode 113 together constitute a photosensitive sensor. Since the material of the intrinsic semiconductor layer 1112 in the PIN diode is amorphous silicon, which can be made thicker, the present application facilitates light absorption, and facilitates making a high-performance photosensitive sensor to thereby improve accuracy of fingerprint recognition.

In the array substrate of the present invention, only two insulating layers are disposed on the planarization layer 109, which are the first insulating layer 112 and the second insulating layer 114. Compared with conventional techniques, which require that at least four insulating layers be disposed on the planarization layer 109, the present invention reduces the number of the insulating layers on the planarization layer 109, thereby reducing the number of photomasks in a manufacturing process of the array substrate and simplifying the manufacturing process.

In some embodiments, the third metal layer further comprises a touch electrode line 1102, and the touch electrode line 1102 is spaced apart from the first electrode 1101 in the third metal layer. Specifically, the third metal layer comprises the first electrode 1101 and the touch electrode line 1102 arranged spaced apart, wherein the first electrode 1101 serves as a bottom electrode of the photosensitive sensor, and the touch electrode line 1102 serves as a lead of a touch electrode.

The fourth metal layer further comprises a common electrode integrally formed with the second electrode 113, the common electrode is disposed corresponding to the touch electrode line 1102 and is electrically connected to the touch electrode line 1102. Specifically, the fourth metal layer comprises the second electrode 113 and the common electrode integrally formed with the second electrode 113, wherein the second electrode 113 serves as an upper electrode of the photosensitive sensor, and the common electrode is configured to allow normal display functions of the display panel.

In the array substrate of the present invention, both the common electrode and the second electrode 113 use the touch electrode line 1102 as a lead. At the same time, the touch electrode line 1102 only serves as the lead of the common electrode or the second electrode 113. Compared with conventional techniques, in which the common electrode and the second electrode 113 use different leads, the present invention realizes multiplex lead wiring and reduces a space occupied by the lead in the array substrate.

In some embodiments, the substrate further comprises a switch element 200. The switch element 200 is preferably a thin film transistor, which is referred to as a second thin film transistor. The second thin film transistor comprises a second active layer, a second gate, a second source 2081, and a second drain 2082, wherein the second active layer is made in a same layer as the first active layer 104 in the first thin film transistor, and the second drain 2082 is disposed in the third metal layer. In other words, the second source 2081 and the second drain 2082 of the second thin film transistor are fabricated in a same layer as the first source 1081 and the first drain 1082 of the first thin film transistor. In addition, the second gate of the second thin film transistor can be fabricated in a same layer as the first gate 106 of the first thin film transistor, or can be fabricated in a different layer from the first gate 106 of the first thin film transistor; and the present application is not limited in this regard.

The array substrate further comprises a fifth metal layer, the fifth metal layer is disposed on the second insulating layer 114, and the fifth metal layer comprises a pixel electrode 115. The pixel electrode 115 is electrically connected to the switch element 200. That is to say, the pixel electrode 115 is electrically connected to the second thin film transistor. Specifically, the pixel electrode 115 is electrically connected to the second source 2081 or the second drain 2082 of the second thin film transistor. The pixel electrode 115 shown in FIG. 1 is electrically connected to the second drain 2082 of the second thin film transistor. A material of the pixel electrode 115 is preferably indium tin oxide.

In some embodiments, a first through hole (not illustrated in FIG. 1) is defined in the first insulating layer 112 to expose at least a portion of the diode 111, and the second electrode 113 is electrically connected to the diode 111 through the first through hole.

In some embodiments, a second through hole (not shown in FIG. 1) is defined in the first insulating layer 112 to expose at least a portion of the touch electrode line 1102, and the common electrode is electrically connected to the touch electrode line 1102 through the second through hole.

In some embodiments, a third through hole (not illustrated in FIG. 1) is defined in the planarization layer 109, the first insulating layer 112, and the second insulating layer 114, and the pixel electrode 115 is electrically connected to the switch element 200 through the third through hole.

In the array substrate of the present invention, the first through hole for connecting the second electrode 113 to the diode 111, and the second through hole for connecting the common electrode to the touch electrode line 1102 are both shallow through holes (referred to as "shallow holes" for short). These shallow holes can be formed before the fourth metal layer is formed. The third through hole used to connect the pixel electrode 115 to the second drain 2082 in the second thin film transistor is a deep through hole (referred to as a "deep hole" for short). The deep hole can be formed after the second insulating layer 114 is formed. Compared with conventional techniques which simultaneously form the deep and shallow holes, the present invention prevents a processing risk caused by etching to form the deep and shallow holes simultaneously.

In some embodiments, the orthographic projection of the first electrode 1101 projected on the substrate covers an orthographic projection of the diode 111 projected on the substrate, and the orthographic projection of the second electrode 113 projected on the substrate at least partially overlaps the orthographic projection of the first electrode 1101 projected on the substrate, which can improve the sensitivity of the photosensitive sensor.

In some embodiments, the orthographic projection of the first electrode 1101 projected on the substrate at least partially overlaps the orthographic projection of the second electrode 113 projected on the substrate and an orthographic projection of the control element 100 projected on the substrate, thereby improving an aperture ratio of the array substrate.

In some embodiments, the first thin film transistor further comprises a first active layer 104, and the orthographic projection of the first electrode 1101 projected on the substrate at least partially overlaps the orthographic projection of the first active layer 104 projected on the substrate. Specifically, the orthographic projection of the first electrode 1101 projected on the substrate at least covers a portion of an orthographic projection of the N-type heavily doped region 1043 electrically connected to the first drain 1082 on the substrate, thereby increasing the aperture ratio of the array substrate.

Figure 2:
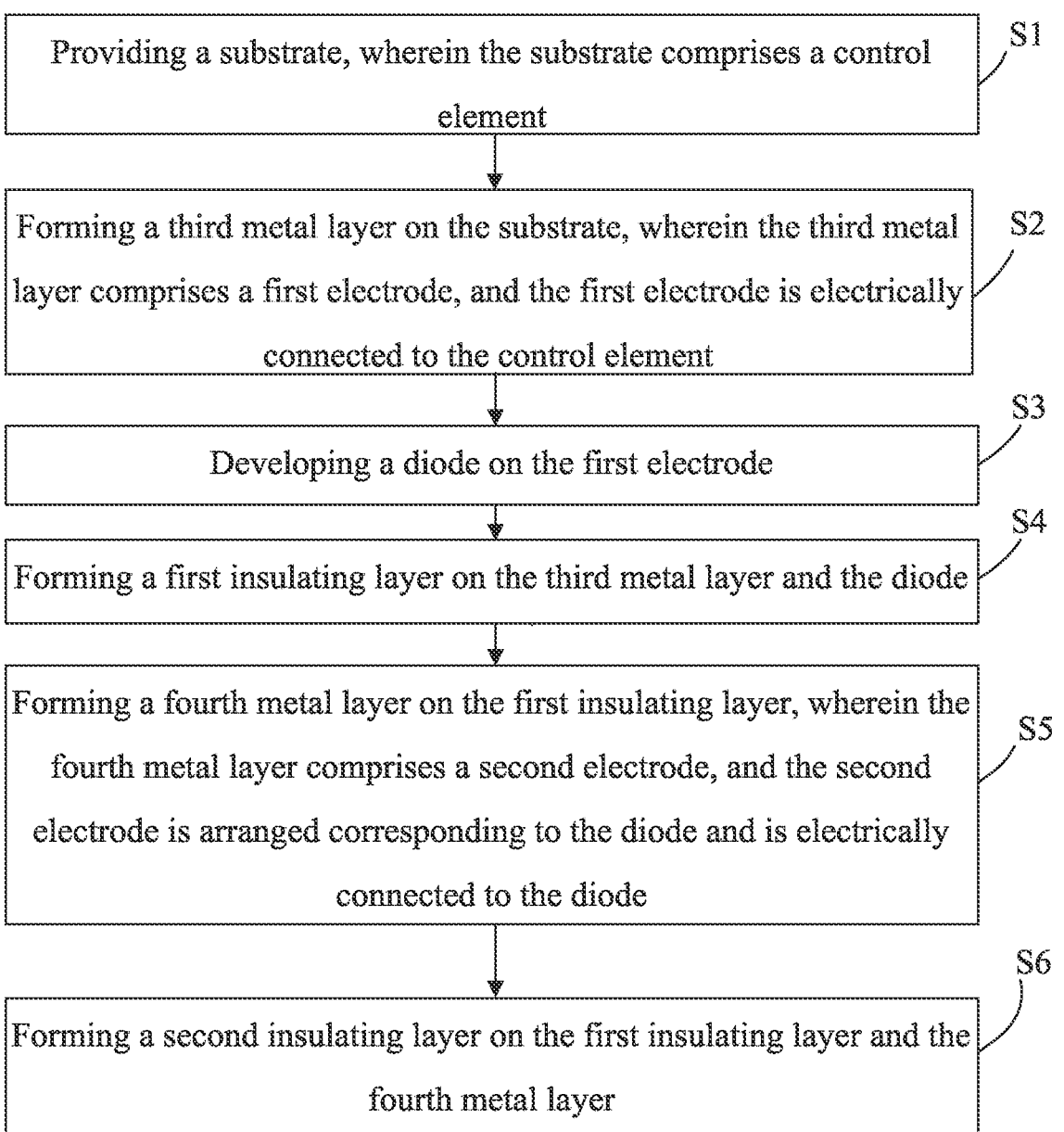
FIG. 2 is a process flow diagram illustrating a manufacturing method of the array substrate according to one embodiment of the present invention.
Figure 3:
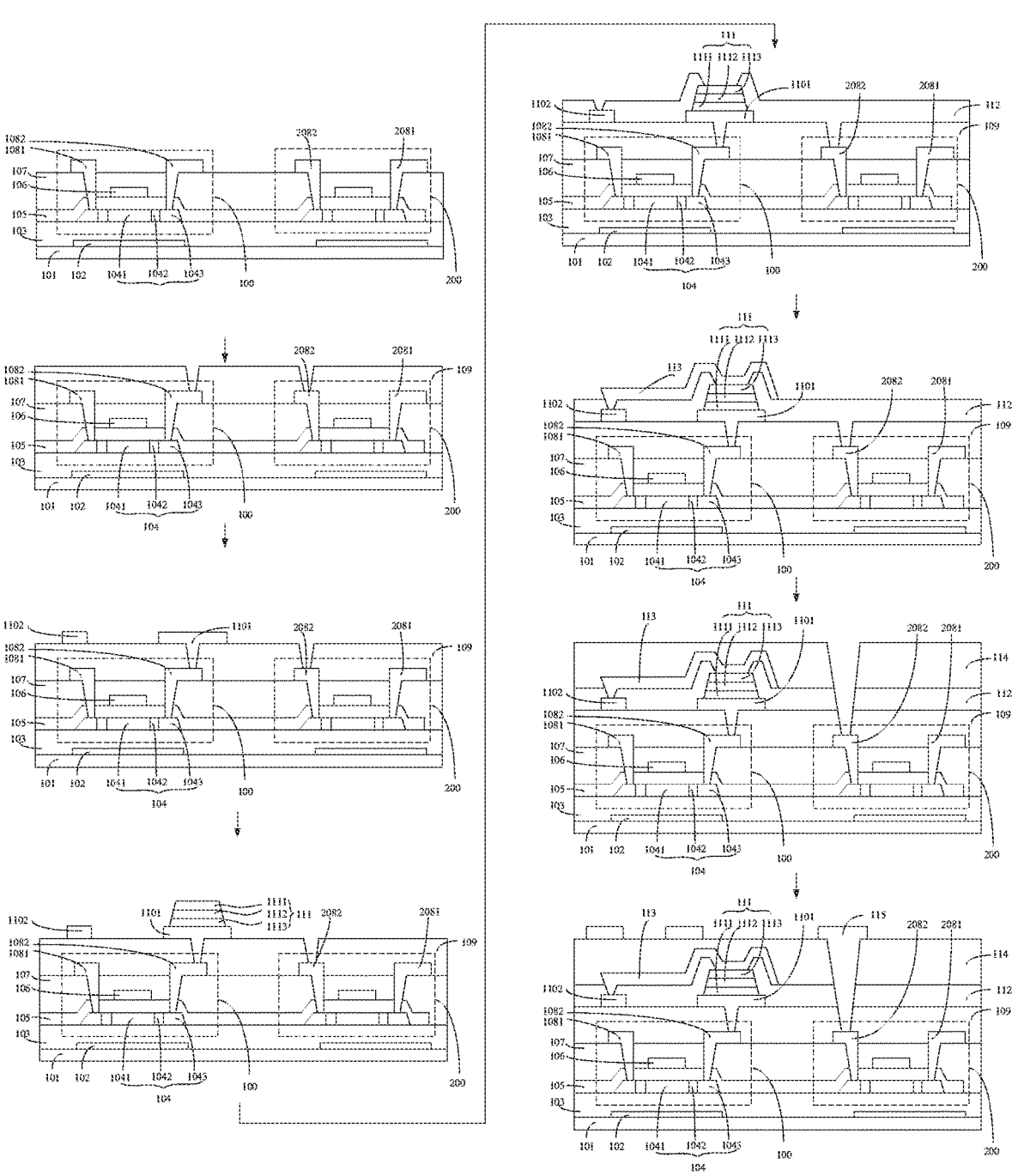
FIG. 3 is a manufacturing process flow chart of the array substrate according to one embodiment of the present invention.

Please refer to FIGS. 2 and 3. FIG. 2 is a process flow diagram illustrating a manufacturing method of an array substrate according to the present invention. FIG. 3 is a manufacturing process flow chart of the array substrate according to the present invention. With reference to FIG. 2 and FIG. 3, the manufacturing method of the present invention comprises following steps:

S1: providing a substrate, wherein the substrate comprises a control element 100.

Specifically, S1 comprises following steps:

S101: providing a base plate 101. The base plate 101 can be a rigid substrate or a flexible substrate. A material of the base substrate 101 can comprise any one or more of glass, silicon dioxide, polyethylene, polypropylene, polystyrene, polylactic acid, polyethylene terephthalate, polyimide, and polyurethane.

S102: forming a light-shielding layer 102 on the base plate 101. Specifically, the base plate 101 is covered with a metal material, and then the metal material is patterned by exposure, etching, etc., to obtain the light-shielding layer 102.

S103: forming a buffer layer 103 on the base plate 101 and the light-shielding layer 102, wherein a material of the buffer layer 103 can be silicon nitride or silicon oxide.

S104: forming a first active layer 104 on the buffer layer 103. Specifically, the buffer layer 103 is covered with monocrystalline silicon (a-Si). Then, excimer laser annealing is performed on the monocrystalline silicon to convert the monocrystalline silicon into polysilicon (poly Si), After that, the polysilicon is patterned by exposure and etching. Afterwards, two ends of the patterned polysilicon are doped with phosphorus (P) ions to form an N-type heavily doped region 1043, thereby obtaining the first active layer 104.

S105: forming a gate insulating layer 105 on the buffer layer 103 and the first active layer 104, wherein a material of the gate insulating layer 105 can be silicon nitride, silicon oxide, or organic photoresist.

S106: forming a first metal layer on the gate insulating layer 105. Specifically, the gate insulating layer 105 is covered with a metal material such as copper, titanium, or aluminum, and then the metal material is patterned by exposure and etching to obtain the first metal layer comprising a first gate 106.

S107: performing N-ion doping on the first active layer 104 to form an N-type lightly doped region 1042 between the N-type heavily doped region 1043 and the polysilicon.

S108: forming an interlayer dielectric layer 107 on the gate insulating layer 105 and the first metal layer, wherein a material of the interlayer dielectric layer 107 can be silicon nitride or silicon oxide.

S109: forming through holes in the interlayer dielectric layer 107 and the gate insulating layer 105 to correspond to the N-type heavily doped region 1043 at two ends of the first active layer 104.

S110: forming a second metal layer on the interlayer dielectric layer 107. Specifically, a metal material such as copper, titanium, or aluminum is used to cover the interlayer dielectric layer 107, such that the metal material is electrically connected to the N-type heavily doped regions 1043 at the two ends of the first active layer 104 through the through holes in the interlayer dielectric layer 107 and the gate insulating layer 105. Then, the metal material is patterned to obtain a second metal layer comprising a first source 1081 and a first drain 1082.

It should be noted that a description about a manufacturing process of a switch element 200 is omitted in the above steps, but the manufacturing process of the switch element 200 can be similar to a manufacturing process of the control element 100, so its description is omitted for brevity. The switch element 200 and the control element 100 can be produced at the same time or at different times, which is not limited here. However, it should be noted that the second metal layer of the substrate having the switch element 200 also comprises a second source 2081 and a second drain 2082.

It should be noted that between steps S1 and S2, the manufacturing method further comprises: forming a planarization layer 109 on the interlayer dielectric layer 107 and the second metal layer. A material of the planarization layer 109 can be silicon nitride, silicon oxide, or organic photoresist, and a through hole is defined in the planarization layer 109 to correspond to the first drain 1082.

S2: forming a third metal layer on the substrate, wherein the third metal layer comprises a first electrode 1101, and the first electrode 1101 is electrically connected to the control element 100.

Specifically, a metal material is used to cover the planarization layer 109, and the metal material is electrically connected to the first drain 1082 through the through hole in the planarization layer 109. Then, the metal material is patterned to obtain a third metal layer comprising the first electrode 1101. The metal material can be any one of titanium, aluminum, molybdenum, copper, or other suitable metal, and can also be a metal lamination material such as titanium-aluminum-titanium, molybdenum-copper, or molybdenum-aluminum-molybdenum.

It should be noted that, the third metal layer in this step further comprises a touch electrode line 1102, and the touch electrode line 1102 is spaced apart from the first electrode 1101 in the third metal layer.

S3: forming a diode 111 on the first electrode 1101.

Specifically, a first semiconductor layer 1111 and an intrinsic semiconductor layer 1112 are sequentially formed on the first electrode 1101, and the first semiconductor layer 1111 and the intrinsic semiconductor layer 1112 are patterned to obtain a PIN diode. A material of the first semiconductor layer 1111 is preferably N-type amorphous silicon, and a material of the intrinsic semiconductor layer 1112 is preferably amorphous silicon. In addition, before patterning, a second semiconductor layer 1113 can be formed on the intrinsic semiconductor layer 1112, and the first semiconductor layer 1111, the intrinsic semiconductor layer 1112, and the second semiconductor layer 1113 are patterned to obtain the PIN diode. A material of the second semiconductor layer 1113 is preferably P-type amorphous silicon.

S4: forming a first insulating layer 112 on the third metal layer and the diode 111. A material of the first insulating layer 112 can be silicon nitride or silicon oxide.

It should be noted that after S4 and before S5, it is required to define a first through hole and a second through hole in the first insulating layer 112, wherein the first through hole is arranged corresponding to the PIN diode, and the second through hole is arranged corresponding to the touch electrode line 1102.

S5: forming a fourth metal layer on the first insulating layer 112, wherein the fourth metal layer comprises a second electrode 113, and the second electrode 113 is arranged corresponding to the diode 111 and is electrically connected to the diode 111.

Specifically, a metal material such as indium tin oxide is used to cover the first insulating layer 112, and the metal material is electrically connected to the PIN diode through the first through hole. Then, the metal material is patterned to obtain the fourth metal layer comprising the second electrode 113. It should be noted that if the PIN diode only comprises the first semiconductor layer 1111 and the intrinsic semiconductor layer 1112, the metal material is electrically connected to the intrinsic semiconductor layer 1112. If the PIN diode comprises the first semiconductor layer 1111, the intrinsic semiconductor layer 1112, and the second semiconductor layer 1113, then the metal material is electrically connected to the second semiconductor layer 1113.

It should be noted that the fourth metal layer in this step further comprises a common electrode integrally formed with the second electrode 113, and the common electrode is electrically connected to the touch electrode line 1102 through the second through hole.

S6: forming a second insulating layer 114 on the first insulating layer 112 and the fourth metal layer. A material of the second insulating layer 114 can be silicon nitride or silicon oxide.

It should be noted that the first active layer 104, the first gate 106, the first source 1081, and the first drain 1082 together constitute the control element 100, that is, the first thin film transistor. The first electrode 1101, the PIN diode, and the second electrode 113 together constitute a photosensitive sensor. Since a material of the intrinsic semiconductor layer 1112 in the PIN diode is amorphous silicon, which can be made thicker, the present application facilitates light absorption and facilitates making a high-performance photosensitive sensor, thereby improving accuracy of fingerprint recognition.

After S6, the manufacturing method also comprises following steps:

S7: defining a third through hole in the planarization layer 109, the first insulating layer 112, and the second insulating layer 114.

S8: forming a pixel electrode 115 on the second insulating layer 114, wherein the pixel electrode 115 is electrically connected to the second drain 2082 through the third through hole.

Specifically, a metal material such as indium tin oxide is used to cover the second insulating layer 114, and the metal material is electrically connected to the second drain 2082 through the third through hole. Then, the metal material is patterned to obtain a fourth metal layer comprising the pixel electrode 115.

The present invention also provides a display panel, which comprises the array substrate of any of the foregoing embodiments. The display panel can be a liquid crystal display panel. The display panel further comprises a second substrate, and the second substrate is preferably a color filter substrate. The second substrate is arranged corresponding to the array substrate, and a liquid crystal layer is also arranged between the array substrate and the second substrate.

The present invention further provides a display device, which comprises the display panel of any of the above-mentioned embodiments, a control circuit, and a housing. It should be noted that the display device is not limited to the above content, and the display device can also include other devices, such as a camera and an antenna structure.

The display panel is arranged on the casing.

In some embodiments, the display panel can be fixed to the housing, and the display panel and the housing form a closed space to accommodate components such as control circuits.

In some embodiments, the housing can be made of a flexible material, such as a plastic housing or a silicone housing.

The control circuit is installed in the housing, the control circuit can be a main board of the display device, and the control circuit can integrate one or more of a battery, an antenna structure, a microphone, a speaker, a headphone interface, a universal serial bus interface, a camera, a distance sensor, an ambient light sensor, a receiver, or a processor, or other functional component.

The display panel is installed in the housing, and at the same time, the display panel is electrically connected to the control circuit to form a display surface of the display device. The display panel can include a display area and a non-display area. The display area can be used to display images of the display device or for the user to perform touch operations. The non-display area can be used to set various functional components.

The display device comprises, but is not limited to, mobile phones, tablet computers, computer monitors, game consoles, televisions, display screens, wearable devices, and other household appliances or household appliances with display functions.

It should be noted that for those of ordinary skill in the art, equivalent substitutions or changes can be made according to the technical solution of the present invention and its inventive concept, and all these changes or substitutions shall fall within the protection scope of the present invention defined by the appended claims.

What is claimed is:

1. An array substrate, comprising:
a substrate comprising a control element, wherein the substrate further comprises a switch element;
a third metal layer disposed on the substrate, the third metal layer comprising a first electrode and a touch electrode line, the first electrode electrically connected to the control element;

a diode arranged on the first electrode;
a first insulating layer disposed on the third metal layer and the diode;
a fourth metal layer disposed on the first insulating layer, the fourth metal layer comprising a second electrode and a common electrode integrally formed with the second electrode, the second electrode disposed corresponding to the diode and electrically connected to the diode, wherein the common electrode is arranged corresponding to the touch electrode line and electrically connected to the touch electrode line;
a second insulating layer disposed on the first insulating layer and the fourth metal layer; and
a fifth metal layer disposed on the second insulating layer, wherein the fifth metal layer comprises a pixel electrode, and the pixel electrode is electrically connected to the switch element.

2. The array substrate according to claim 1, wherein a first through hole is defined in the first insulating layer to expose at least a portion of the diode, and the second electrode is electrically connected to the diode through the first through hole.

3. The array substrate according to claim 1, wherein a second through hole is defined in the first insulating layer to expose at least a portion of the touch electrode line, and the common electrode is electrically connected to the touch electrode line through the second through hole.

4. The array substrate according to claim 1, wherein a planarization layer is disposed between the substrate and the third metal layer; a third through hole is defined in the planarization layer, the first insulating layer, and the second insulating layer; and the pixel electrode is electrically connected to the switch element through the third through hole.

5. The array substrate according to claim 1, wherein the control element is a first thin film transistor, the first electrode is electrically connected to a source or a drain of the first thin film transistor, the switch element is a second thin film transistor, and the pixel electrode is electrically connected to a source or a drain of the second thin film transistor.

6. The array substrate according to claim 1, wherein an orthographic projection of the first electrode projected on the substrate covers an orthographic projection of the diode projected on the substrate, and an orthographic projection of the second electrode at least partially overlaps the orthographic projection of the first electrode projected on the substrate.

7. The array substrate according to claim 1, wherein an orthographic projection of the first electrode projected on the substrate and an orthographic projection of the second electrode projected on the substrate at least partially overlap an orthographic projection of the control element projected on the substrate.

8. The array substrate according to claim 5, wherein the first thin film transistor further comprises an active layer, and an orthographic projection of the first electrode projected on the substrate at least partially overlaps an orthographic projection of the active layer projected on the substrate.

9. The array substrate according to claim 1, wherein the diode is a PIN diode, the PIN diode comprises a first semiconductor layer and an intrinsic semiconductor layer, the first semiconductor layer is disposed on the first electrode, and the intrinsic semiconductor layer is arranged on the first semiconductor layer.

10. The array substrate according to claim 9, wherein the PIN diode further comprises a second semiconductor layer, and the second semiconductor layer is disposed on the intrinsic semiconductor layer.

11. A display panel comprising an array substrate, the array substrate comprising:

a substrate comprising a control element, wherein the substrate further comprises a switch element;

a third metal layer disposed on the substrate, the third metal layer comprising a first electrode and a touch electrode line, the first electrode electrically connected to the control element;

a diode arranged on the first electrode;

a first insulating layer disposed on the third metal layer and the diode;

a fourth metal layer disposed on the first insulating layer, the fourth metal layer comprising a second electrode and a common electrode integrally formed with the second electrode, the second electrode disposed corresponding to the diode and electrically connected to the diode, wherein the common electrode is arranged corresponding to the touch electrode line and electrically connected to the touch electrode line;

a second insulating layer disposed on the first insulating layer and the fourth metal layer; and a fifth metal layer disposed on the second insulating layer, wherein the fifth metal layer comprises a pixel electrode, and the pixel electrode is electrically connected to the switch element.

12. The display panel according to claim 11, wherein a first through hole is defined in the first insulating layer to expose at least a portion of the diode, and the second electrode is electrically connected to the diode through the first through hole.

13. The display panel according to claim 11, wherein a second through hole is defined in the first insulating layer to expose at least a portion of the touch electrode line, and the common electrode is electrically connected to the touch electrode line through the second through hole.

14. The display panel according to claim 11, wherein a planarization layer is disposed between the substrate and the third metal layer; a third through hole is defined in the planarization layer, the first insulating layer, and the second insulating layer; and the pixel electrode is electrically connected to the switch element through the third through hole.

15. The display panel according to claim 11, wherein the control element is a first thin film transistor, the first electrode is electrically connected to a source or a drain of the first thin film transistor, the switch element is a second thin film transistor, and the pixel electrode is electrically connected to a source or a drain of the second thin film transistor.

16. An array substrate, comprising:

a substrate comprising a control element;

a third metal layer disposed on the substrate, the third metal layer comprising a first electrode, the first electrode electrically connected to the control element;

a diode arranged on the first electrode;

a first insulating layer disposed on the third metal layer and the diode;

a fourth metal layer disposed on the first insulating layer, the fourth metal layer comprising a second electrode, the second electrode disposed corresponding to the diode and electrically connected to the diode; and a second insulating layer disposed on the first insulating layer and the fourth metal layer, wherein an orthographic projection of the first electrode projected on the substrate and an orthographic projection of the second electrode projected on the substrate at least partially overlap an orthographic projection of the control element projected on the substrate.

17. The array substrate according to claim 16, wherein a first through hole is defined in the first insulating layer to expose at least a portion of the diode, and the second electrode is electrically connected to the diode through the first through hole.

18. The array substrate according to claim 16, wherein a second through hole is defined in the first insulating layer to expose at least a portion of the touch electrode line, and the common electrode is electrically connected to the touch electrode line through the second through hole.

19. The array substrate according to claim 16, wherein an orthographic projection of the first electrode projected on the substrate covers an orthographic projection of the diode projected on the substrate, and an orthographic projection of the second electrode at least partially overlaps the orthographic projection of the first electrode projected on the substrate.

20. The array substrate according to claim 16, wherein the diode is a PIN diode, the PIN diode comprises a first semiconductor layer and an intrinsic semiconductor layer, the first semiconductor layer is disposed on the first electrode, and the intrinsic semiconductor layer is arranged on the first semiconductor layer.

* * * * *